United States Patent
Takeuchi et al.

(10) Patent No.: US 6,737,940 B2
(45) Date of Patent: May 18, 2004

(54) PIEZOELECTRIC RESONATOR, MANUFACTURING METHOD FOR THE SAME, PIEZOELECTRIC FILTER, MANUFACTURING METHOD FOR THE SAME, DUPLEXER, AND ELECTRONIC COMMUNICATION DEVICE

(75) Inventors: Masaki Takeuchi, Otsu (JP); Hajime Yamada, Otsu (JP); Yoshihiko Goto, Shiga-ken (JP); Tadashi Nomura, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 15 days.

(21) Appl. No.: 10/175,088

(22) Filed: Jun. 20, 2002

(65) Prior Publication Data
US 2003/0001689 A1 Jan. 2, 2003

(30) Foreign Application Priority Data

Jul. 2, 2001 (JP) .......................... 2001-200771
Jun. 4, 2002 (JP) .......................... 2002-163026

(51) Int. Cl.[7] .............................. H03H 9/00; B23B 5/28
(52) U.S. Cl. .......................... 333/189; 29/25.35
(58) Field of Search ................................. 333/195, 189, 333/187; 29/25.35; 73/24.06; 310/334; 343/846

(56) References Cited

U.S. PATENT DOCUMENTS

| 4,081,769 | A | * | 3/1978 | Shreve | ........................ 333/195 |
| 5,361,077 | A | * | 11/1994 | Weber | ........................ 343/846 |
| 5,936,150 | A | * | 8/1999 | Kobrin et al. | ............. 73/24.06 |
| 6,243,933 | B1 | * | 6/2001 | Sugimoto et al. | .......... 29/25.35 |
| 6,496,085 | B2 | * | 12/2002 | Ella et al. | ................... 333/189 |
| 6,601,276 | B2 | * | 8/2003 | Barber | ....................... 29/25.35 |

* cited by examiner

Primary Examiner—Patrick Wamsley
(74) Attorney, Agent, or Firm—Keating & Bennett, LLP

(57) ABSTRACT

A piezoelectric resonator includes a substrate and a plurality of vibrating portions constructed such that a thin film portion having a piezoelectric thin film of one or more layers is sandwiched by at least a pair of upper electrodes and a lower electrode, which are opposed to each other, on the upper and lower surfaces of the thin film portion. The vibrating portions are separated by at least a distance equal to about $\lambda/2$, where $\lambda$ represents the vibration wavelength, from elements affecting the vibration characteristics.

20 Claims, 10 Drawing Sheets

PIEZOELECTRIC RESONATOR, MANUFACTURING METHOD FOR THE SAME, PIEZOELECTRIC FILTER, MANUFACTURING METHOD FOR THE SAME, DUPLEXER, AND ELECTRONIC COMMUNICATION DEVICE

BACKGROUND OF THE INVENTION

1. Field of the Invention

The present invention relates to a piezoelectric resonator, a method of manufacturing the piezoelectric resonator, a piezoelectric filter, a method of manufacturing the piezoelectric filter, a duplexer, and an electronic communication device. More particularly, the piezoelectric resonator is used in filters, oscillators, and other suitable devices, thickness longitudinal vibrations are generated in the VHF, UHF, and higher frequency bands, and vibrating portions are provided on a diaphragm.

2. Description of the Related Art

The construction of a related piezoelectric resonator of this type includes a thin-film diaphragm that is provided on a substrate having a uniform thickness so as to cover an opening formed in the substrate. A laminated body, in which a piezoelectric thin film is sandwiched by upper and lower electrodes, is mounted on the upper surface of the diaphragm. When a voltage signal is applied between the electrodes, the laminated body as a vibrating portion resonates on the diaphragm. It becomes possible for such a piezoelectric resonator to resonate in higher frequency bands when the piezoelectric film is made thinner.

In the piezoelectric resonator of this type, the vibrating portion is spaced a fixed distance from the diaphragm fixing ends so that the vibrating portion may perform required vibrations.

Furthermore, in the case of a piezoelectric resonator in which a plurality of vibrating portions are provided on a diaphragm, the vibrating portions are located a fixed distance away from each other on the diaphragm so that the resonance characteristics of each of the vibrating portions may not be influenced by the other vibrating portions.

Then, in such a piezoelectric resonator, to make the resonator smaller, it is considered that the vibrating portions are provided so as to be close to the diaphragm fixing ends and the other vibrating portions. In this case, if the vibrating portions are too close to the diaphragm fixing ends and the other vibrating portions, etc., the size of the piezoelectric resonator can be achieved. But, they influence the vibration characteristics. To the contrary, if the vibrating portions are too far from the diaphragm fixing ends and the other vibrating portions, etc., their influence on the vibration characteristics diminishes or disappears. But, the size becomes larger. Thus, when the vibrating portions are disposed on a diaphragm, it is very difficult to achieve a highly precise position of the vibrating portions. Therefore, the performance of the piezoelectric resonator, and other devices including such a piezoelectric resonator, is degraded or its productivity becomes lower.

Such disadvantages can be also seen in the filtering characteristics of a filter in which a plurality of these piezoelectric resonators is combined.

In a dual mode filter and ladder filter, the resonators must be separated by a predetermined distance from each other so that the vibration of the adjacent resonators does not influence the other. In case of the dual mode filter, even if the resonators are separated too far from each other, the characteristics do not deteriorate. However, in the case of a ladder filter, the upper electrode or lower electrode of one resonator and the upper electrode or lower electrode of another adjacent resonator are integrally formed and they are required to be electrically connected. Therefore, if a distance between the resonators is greater than $3\lambda$ in order to prevent vibrational interference, the wiring between the resonators is lengthened, and the resistance of the wiring and an inductance due to the wiring are generated between the resonators. As a result, the characteristics are deteriorated. In particular, if the wiring resistance is generated between the resonators connected in series, insertion loss is increased.

SUMMARY OF THE INVENTION

In order to overcome the problems described above, preferred embodiments of the present invention minimize the influence of one of the vibration portions on the resonance characteristics of the other and also minimize the total dimensions of the device.

According to a preferred embodiment of the present invention, a piezoelectric resonator includes a substrate and a plurality of vibrating portions constructed such that a thin film portion having a piezoelectric thin film of one or more layers disposed on the substrate is sandwiched between at least a pair of upper electrodes and a lower electrode, opposed to each other, on the upper and lower surfaces of the thin film portion, the vibrating portions are separated by at least about $\lambda/2$ ($\lambda$ represents the vibration wavelength) from elements affecting the vibration characteristics.

According to this preferred embodiment of the present invention, since the vibrating portions are separated by at least about $\lambda/2$ from elements affecting the vibration characteristics, for example, the opening end portions or the other vibrating portions, the vibration characteristics are not improperly influenced by the elements such as the opening end portions and other portions, as in the case when the vibrating portions are located too close to the opening end portions or other portions. In addition, the piezoelectric resonator has a significantly reduced size and excellent vibration characteristics.

In the above-described piezoelectric resonator of the present invention, the substrate preferably includes an opening portion or concave portion and the vibrating portions are preferably disposed in the opening portion or concave portion. The periphery of the opening portion or concave portion and the vibrating portions constitute the elements affecting vibration characteristics.

In the piezoelectric resonator of the preferred embodiments of the present invention, the vibrating portions preferably include an insulation film below the lower electrode and a beam on the lower surface of the insulation film to increase the mechanical strength of the vibrating portions and the vibrating portions are separated by at least about $\lambda/2$ from the beam which is an element affecting the vibration characteristics. In this way, even if the vibrating portions are separated by at least about $\lambda/2$ from the beam, a piezoelectric resonator having such a construction can be made smaller while the performance of the piezoelectric resonator or a device including such a piezoelectric resonator is maintained at a sufficiently high quality.

Preferably, in a piezoelectric resonator of preferred embodiments of the present invention, the vibrating portions are preferably separated by about $3\lambda$ or less from the elements.

More preferably, in a piezoelectric resonator of preferred embodiments of the present invention, the piezoelectric thin film preferably includes zinc oxide or aluminum nitride as a main component.

In a method of manufacturing a piezoelectric resonator according to another preferred embodiment of the present invention, the piezoelectric resonator including a substrate having an opening portion or concave portion and a plurality of vibrating portions constructed such that a thin film portion having a piezoelectric thin film of one or more layers, which is disposed in the opening portion or concave portion, is sandwiched between at least a pair of upper electrodes and a lower electrode, opposed to each other, on the upper and lower surfaces of the thin film portion, the method includes the step of forming the vibrating portions to be separated by at least about $\lambda/2$ ($\lambda$ represents the vibration wavelength) from elements affecting the vibrating characteristics and formed in the opening portion or concave portion.

According to preferred embodiments of the present invention, since the vibrating portions are separated by at least about $\lambda/2$ from elements affecting the vibration characteristics, from the opening end portions or the other vibrating portions, undesired influence of the elements such as the opening end portions and other vibrating portions, on the vibration characteristics as in the case when the vibrating portions are too close to the elements which affect vibration portions is reliably prevented. In addition, a piezoelectric resonator having a greatly reduced size and excellent characteristics is provided.

In a piezoelectric filter of a preferred embodiment of the present invention including a substrate and a plurality of vibrating portions constructed such that a thin film portion having a piezoelectric thin film of one or more layers disposed on the substrate, is sandwiched between at least a pair of upper electrodes and a lower electrode, disposed opposite to each other, on the upper and lower surfaces of the thin film portion, the vibrating portions are connected so as to constitute a filter for a required frequency band, and the vibrating portions are separated by at least about $\lambda/2$ ($\lambda$ represents the vibration wavelength) from elements affecting the vibration characteristics.

According to preferred embodiments of the present invention, since the vibrating portions are separated by at least about $\lambda/2$ from elements affecting the vibration characteristics, for example, from the opening end portions, or the other vibrating portions, undesired influence of the elements such as the opening end portions or other portions, on the vibration characteristics as in the case when the vibrating portions are too close to the elements that affect vibration characteristics is avoided, and a piezoelectric resonator having a greatly reduced size can be easily manufactured while still having excellent characteristics.

Preferably, in the above-described piezoelectric filter, a substrate includes an opening portion or concave portion and the vibrating portions are preferably formed in the opening portion or concave portion.

The periphery of the opening portion or concave portion and the other vibrating portions constitute the elements that affect the vibration characteristics.

In the above-described piezoelectric filter, a beam is preferably provided on the lower surface of a diaphragm in order to increase the mechanical strength of the diaphragm, and, even if the vibrating portions are separated by at least about $\lambda/2$ from the beam, the piezoelectric filter can be reduced in size in the same way as described above while the excellent performance of the piezoelectric filter is maintained.

Preferably, in the above-described piezoelectric filter, the vibrating portions are preferably separated by about $3\lambda$ or less from the elements that affect the vibration characteristics.

More preferably, in the above-described piezoelectric filter, the piezoelectric thin film preferably includes zinc oxide (ZnO) or aluminum nitride (AlN) as a main component.

More preferably, in the above piezoelectric filter, the vibrating portions preferably constitute a ladder filter.

In a method of manufacturing a piezoelectric filter according to a preferred embodiment of the present invention, the piezoelectric filter including a substrate having an opening portion or concave portion, a plurality of vibrating portions constructed such that a thin film portion having a piezoelectric thin film of one or more layers is sandwiched between at least a pair of upper electrodes and a lower electrode, which are disposed opposite to each other, on the upper and lower surfaces of the thin film portion and formed in the opening portion or concave portion, and the vibrating portions connected to constitute a filter for a required frequency band, a process, includes a step in which the vibrating portions are formed so as to be separated by at least about $\lambda/2$ ($\lambda$ represents the vibration wavelength) from elements affecting the vibrating characteristics.

According to preferred embodiments of the present invention, since the vibrating portions are separated by at least about $\lambda/2$ from elements affecting the vibration characteristics, for example, from the opening end portions, the other vibrating portions, or other portions, undesired influence of the elements such as the opening end portions, other vibrating portions, etc., on the vibration characteristics as in the case when the vibrating portions are too close to the elements, is prevented, and a piezoelectric resonator having a greatly reduced size can be easily manufactured while excellent characteristics thereof are maintained.

In a duplexer according to another preferred embodiment of the present invention, a piezoelectric filter of other preferred embodiments of the present invention is used. Thus, a duplexer in which signal switching, etc., can be satisfactorily accomplished is provided.

In an electronic communication device according to another preferred embodiment of the present invention, a piezoelectric resonator of other preferred embodiments of the present invention is included. Furthermore, in an electronic communication device of another preferred embodiment of the present invention, a piezoelectric filter of other preferred embodiments of the present invention is included. As a result, an electronic communication device, in which the function of signal processing such as modulation, demodulation, etc., is excellent, is provided.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
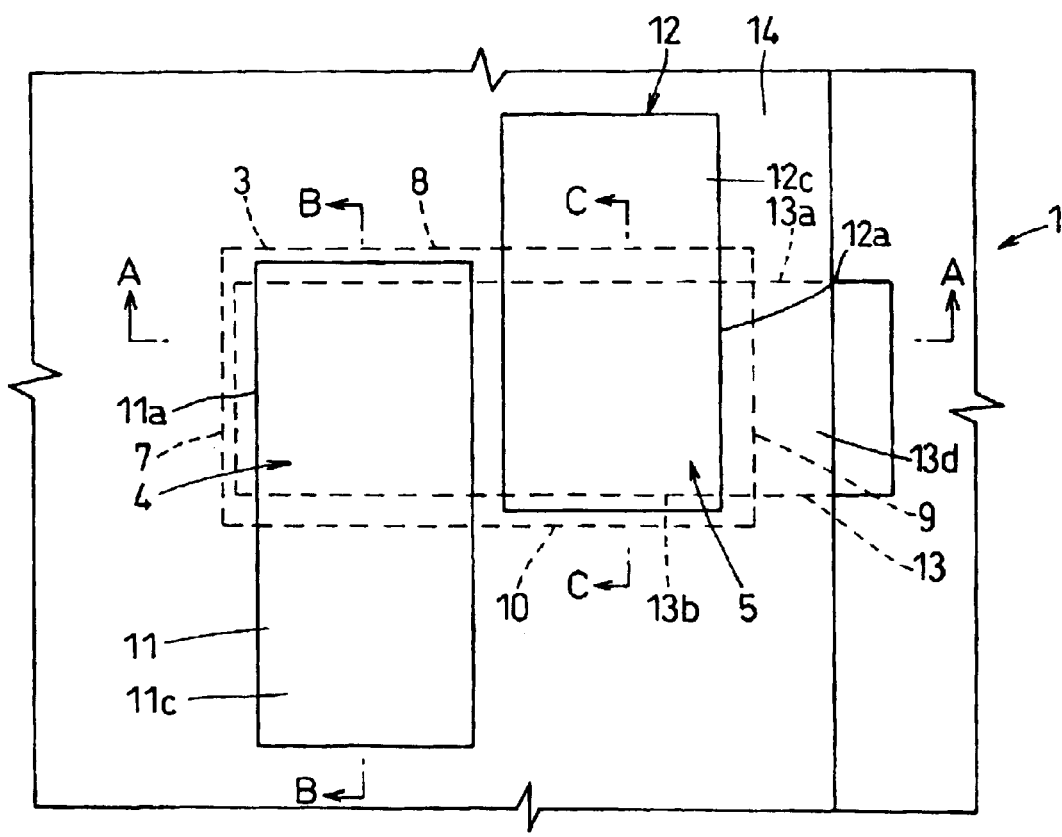
FIG. 1 is a top view showing the essential portion of the construction of a ladder filter as a piezoelectric filter according to a preferred embodiment of the present invention.

Hereinafter, the present invention is described in detail according to various preferred embodiments shown in the drawings. A piezoelectric filter according to the present preferred embodiment, which is applied to a ladder filter, is described, but the application is not limited to that.

Figure 2:
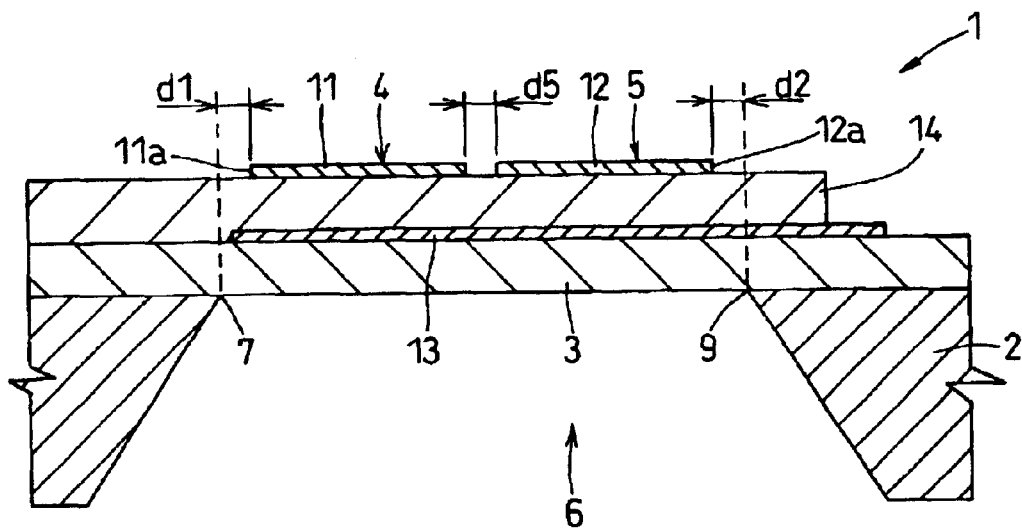
FIG. 2 is a sectional view taken along line A—A of FIG. 1.
Figure 3:
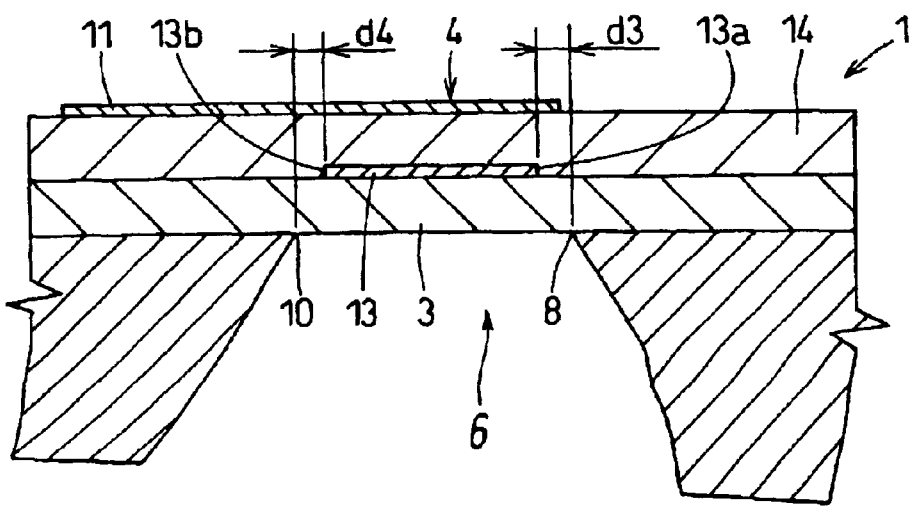
FIG. 3 is a sectional view taken along line B—B of FIG. 1.
Figure 4:
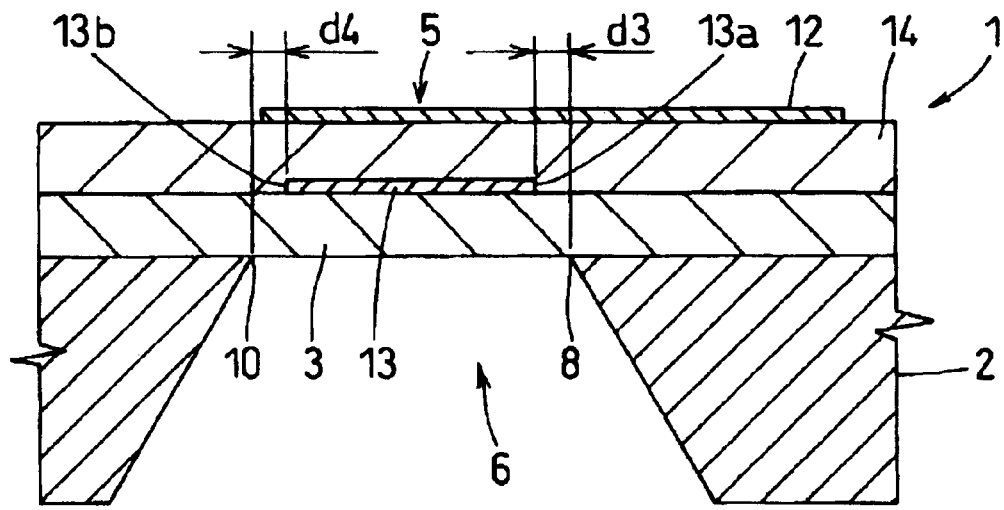
FIG. 4 is a sectional view taken along line C—C of FIG. 1.
Figure 5:
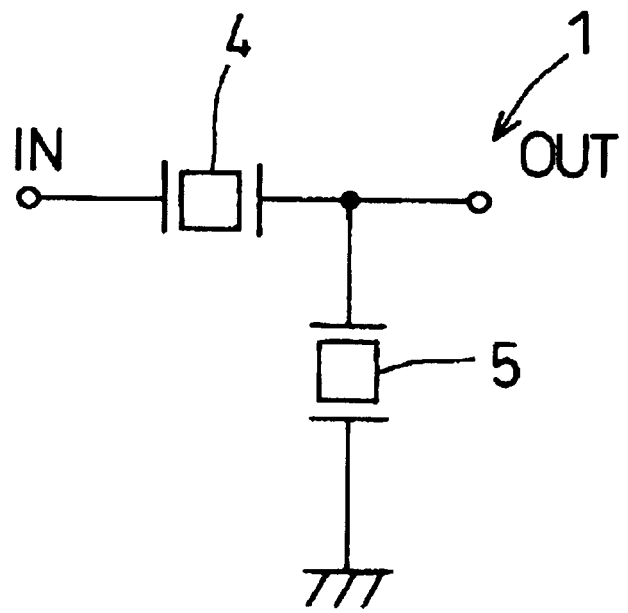
FIG. 5 is an electrical equivalent circuit diagram of the ladder filter in FIG. 1.
Figure 6:
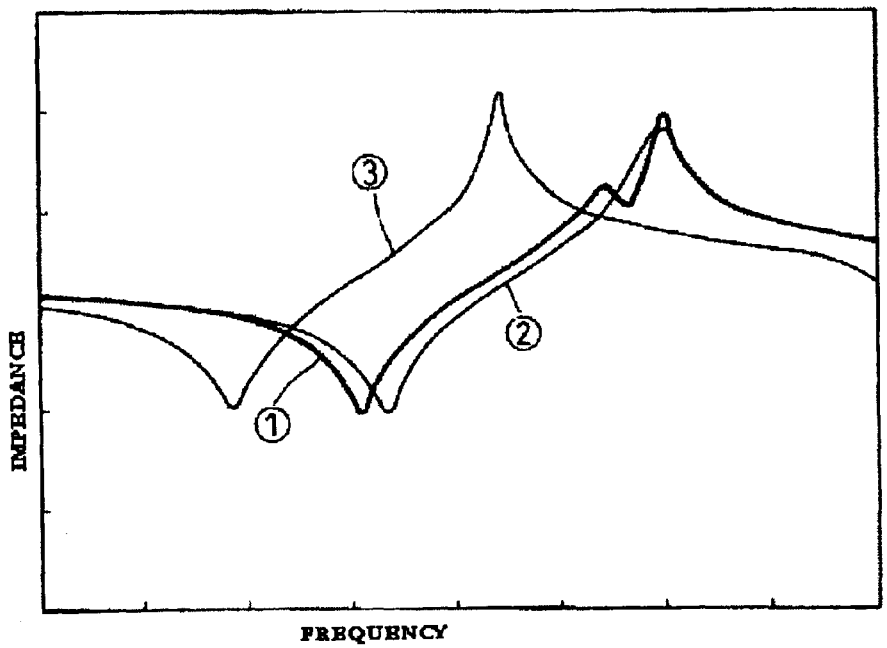
FIG. 6 shows the electrical characteristics of the ladder filter in FIG. 1.

In FIGS. 1 to 6 showing a preferred embodiment of the present invention, FIG. 1 is a top view of an essential portion of a ladder filter as a piezoelectric filter including a piezoelectric resonator of the present preferred embodiment, FIG. 2 is a sectional view taken along line A—A of FIG. 1, FIG. 3 is a sectional view taken along line B—B of FIG. 1, FIG. 4 is a sectional view taken along line C—C of FIG. 1, FIG. 5 is an electrical equivalent circuit diagram of the ladder filter in FIG. 1, and FIG. 6 shows the electrical characteristics of the ladder filter in FIG. 1.

The ladder filter 1 of the present preferred embodiment includes a substrate 2, a diaphragm 3, and first and second vibrating portions 4 and 5.

In this case, the substrate 2, the diaphragm 3, and the first vibrating portion 4 constitute one piezoelectric resonator, and the substrate 2, the diaphragm 3, and the second vibrating portion 5 constitute another piezoelectric resonator. Both of these piezoelectric resonators preferably vibrate in a thickness longitudinal vibration mode and hold the substrate 2 and the diaphragm 3 in common, and the resonators include the same diaphragm 3.

The substrate 2 is preferably made of a material such as silicon or other suitable material, and has an opening 6, which is formed by etching or other suitable process.

The diaphragm 3 is preferably made of a silicon dioxide thin film and other thin films, which are formed by using well-known film-forming technologies or other suitable processes, and disposed on the substrate 2 so as to cover the opening 6 of the substrate 2.

The opening 6 of the substrate 2 is preferably substantially rectangular, when seen from the top, and the inside periphery includes the diaphragm fixing ends 7 to 10 for fixing the diaphragm 3 which are elements that affect the vibration characteristics of each of the vibrating portions (hereinafter called vibration affecting elements).

The vibrating portions 4 and 5 are formed on the upper surface of the diaphragm 3 preferably by known film-forming technologies or other suitable processes, and constructed such that a piezoelectric thin film 14 made of at least one layer of zinc oxide thin film or other suitable film, is sandwiched between a pair of left and right upper electrodes 11 and 12 and a lower electrode 13.

In these vibrating portions 4 and 5, one or more thin films may be added to the piezoelectric film 14 to laminate them or other formations may be considered. Accordingly, the vibrating portions 4 and 5 of the present preferred embodiment merely illustrate only one example and the present invention is not limited by the specific construction of this preferred embodiment. Furthermore, the vibrating portions 4 and 5 may be formed by using known film-forming methods and accordingly their description is omitted.

The vibrating portions 4 and 5 are connected to each other so as to constitute a ladder filter 1 shown in FIG. 5, which has a filtering function in a required frequency band.

The upper electrode 11 of the first vibrating portion 4 has a fixed electrode width, the left side surface 11a is separated a distance of about $\lambda/2$ or more (i.e., d1=$\lambda/2$ or more, or about half a vibration wavelength, the vibration wavelength represented by $\lambda$) from the left diaphragm fixing end 7 which is substantially parallel to the left side surface 11a, and the lower end side of the upper electrode 11 in the drawing is extended on the substrate 2 to form an input portion (IN) 11c for an electrical signal of the ladder filter 1.

The upper electrode 12 of the second vibrating portion 5 has a fixed electrode width, the right side surface 12a is separated a distance of about $\lambda/2$ or more (i.e., d2=$\lambda/2$ or more) from the right diaphragm fixing end 9 which is substantially parallel to the right side surface 12a, and the upper end side of the upper electrode in the drawing is extended on the substrate 2 to form the electrically grounding portion (GRD) 12c of the ladder filter 1.

Both vibrating portions 4 and 5 have the lower electrode 13 in common, the upper side surface 13a of the electrode 13 is separated by a distance of about $\lambda/2$ or more (i.e., d3=$\lambda/2$ or more) from the upper diaphragm fixing end 8 which is substantially parallel to the upper side surface 13a, the lower side surface 13b is separated by a distance of about $\lambda/2$ or more (i.e., d4=$\lambda/2$ or more) from the lower diaphragm fixing end 10 which in the drawing is substantially parallel to the lower side surface 13b, and the right side end is extended on the substrate 2 to form an electrical output portion (OUT) 13d of the ladder filter 1.

Furthermore, since both vibrating portions 4 and 5 become vibration affecting elements which affect the vibration characteristics of each other, the vibrating portions 4 and 5 disposed substantially parallel to each other are separated by a distance of about $\lambda/2$ or more (i.e., d5=$\lambda/2$ or more) from each other.

The ladder filter 1 having the above-described unique construction is electrically built as shown in FIG. 5. That is, the first vibrating portion 4 constitutes a first filtering element 4 in FIG. 5 and the second vibrating portion 5 constitutes a second filtering element 5. The input portion IN of the ladder filter 1 corresponds to the input portion 11c of the first vibrating portion 4. The output portion OUT of the ladder filter 1 corresponds to the output portion 13d of the second vibrating portion 5. The grounding portion GND of the ladder filter 1 corresponds to the grounding portion 12c in the second vibrating portion 5.

In this way, in the present preferred embodiment, for example, the first vibrating portion 4 is at least about $\lambda/2$ away from the vibration affecting elements. As a result, as shown in FIG. 6 in which the horizontal axis represents frequencies and the vertical axis represents impedances, the first vibrating portion 4 can achieve its original vibrating characteristics without being influenced by the diaphragm fixing ends and the other vibrating portions which define the other vibration affecting elements. In short, the characteristics line (1) shows the case in which the distance from the vibration affecting elements is about $0.48\lambda$, and, since the distance is less than about $\lambda/2$, a spurious response is caused. The characteristics line (2) shows the case in which the distance from the vibration affecting elements is about $1.0\lambda$, and, since the distance is over $\lambda/2$, no spurious response is generated. The characteristics line (3) shows the case in which the distance from the vibration affecting elements is about $4.0\lambda$, and, since the distance is greater than about $\lambda/2$, no spurious response is generated at all.

Furthermore, although the distance between the first vibrating portion 4 and the vibration affecting elements is preferably at least about $\lambda/2$ as described above, the first vibrating portion 4 is more preferably separated by at least about $1\lambda$ from the vibration affecting elements. The same thing can be said about the second vibrating portion 5 as in the first vibrating portion 4.

Therefore, according to the present preferred embodiment, even if the diaphragm 3 is made smaller, since the vibrating portions 4 and 5 can be mounted on the diaphragm 3 without being influenced by the vibration affecting elements, preferred embodiments of the present invention achieve a great contribution to miniaturization of the ladder filter.

Furthermore, the distance between the vibrating portions 4 and the vibration affecting elements is more preferably about $3\lambda$ or less. The same thing can be said about the vibrating portions 5 as in the vibrating portions 4.

When the distance between the vibrating portions 4 or the vibrating portions 5 and the vibration affecting elements is about $3\lambda$ or less, the resistance of the wiring between the resonators, the generation of an inductor component by the wiring, and degradation of the characteristics caused such conditions is reliably prevented.

If the distance is greater than about $3\lambda$ to prevent vibrational interference, the wiring between the resonators is lengthened, and the resistance of the wiring and the inductance component due to the wiring are generated between the resonators, and, as a result, deterioration of the characteristics is caused. In particular, if the resistance of the wiring is inserted between the resonators connected in series, insertion loss increases.

Moreover, the present invention is not limited to the above-described preferred embodiments, and various applications and modification can be considered.

Figure 7:
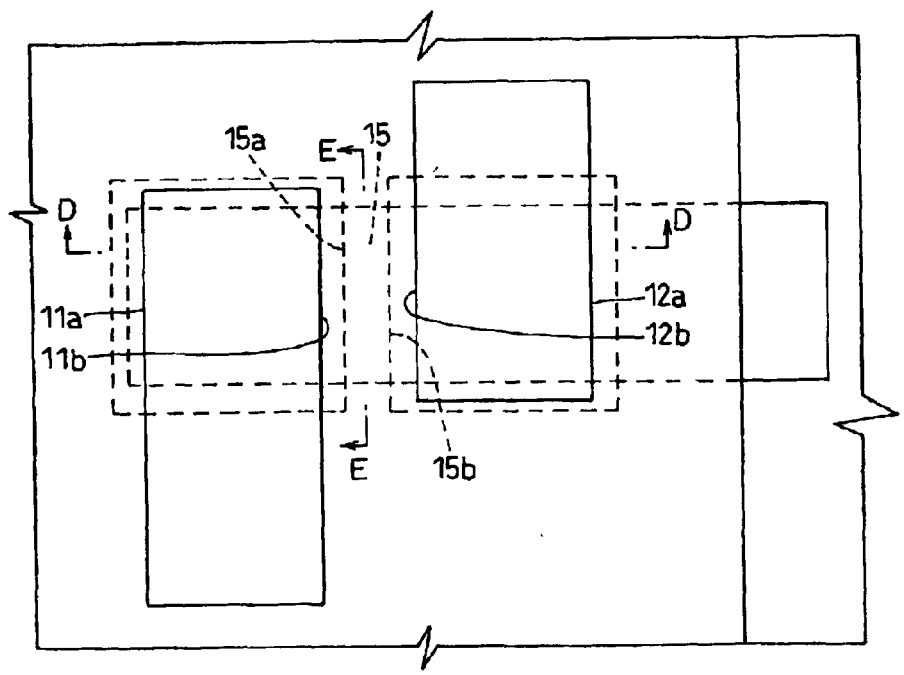
FIG. 7 is a top view showing the essential portion of the construction of a ladder filter as a piezoelectric filter according to another preferred embodiment of the present invention.
Figure 8:
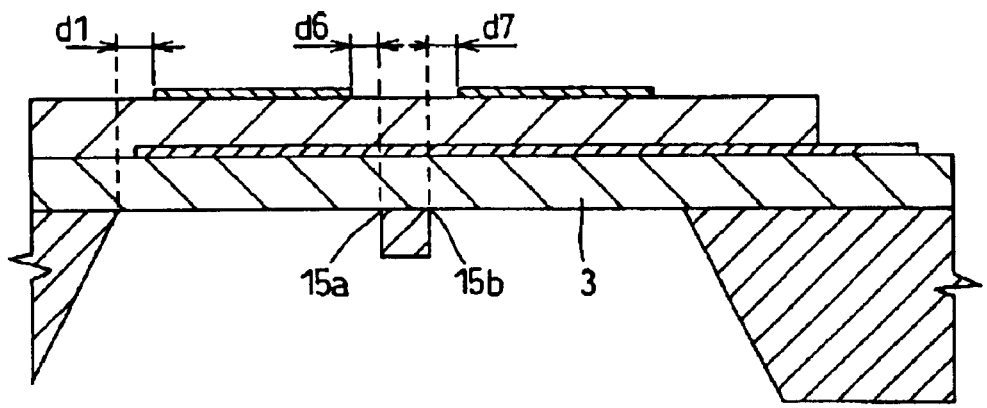
FIG. 8 is a sectional view taken along line D—D of FIG. 7.
Figure 9:
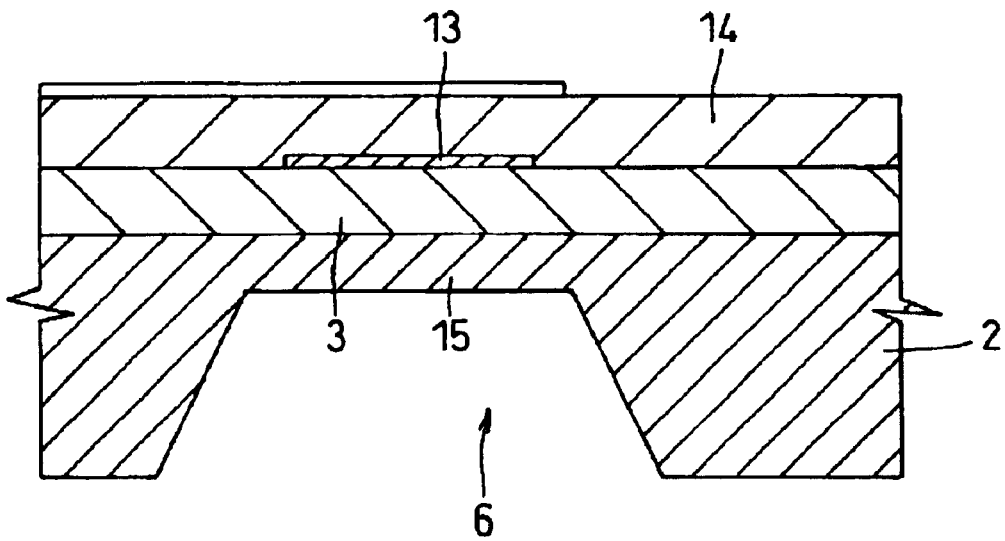
FIG. 9 is a sectional view taken along line E—E of FIG. 7.

FIG. 7 is a top view of a ladder filter as a piezoelectric filter according to another preferred embodiment of the present invention, FIG. 8 is a sectional view taken along line D—D in FIG. 7, and FIG. 9 is a sectional view taken along line E—E in FIG. 7. In the case of the preferred embodiment shown in these drawings, abeam 15 is provided on the lower surface of the diaphragm 3 in order to increase the mechanical strength of the diaphragm 3. Such a beam 15 becomes a vibration affecting element for the vibrating portions 4 and 5. In short, the right side surface 11b of the upper electrode 11 in the vibrating portion 4 is separated by a distance of about $\lambda/2$ or more (i.e., $d6=\lambda/2$ or more) from the left side surface 15a of the beam 15 which is substantially parallel to the right side surface 11b, and the left side surface 12b of the upper electrode 12 in the vibrating portion 5 is separated by a distance of about $\lambda/2$ or more (i.e., $d7=\lambda/2$ or more) from the right side surface 15b of the beam 15 that is substantially parallel to the left side surface 12b.

The method for forming the beam 15 can be considered in various ways such that the portion of the beam 15 is left when the opening 6 is formed in the substrate 2 by etching, for example.

Figure 10:
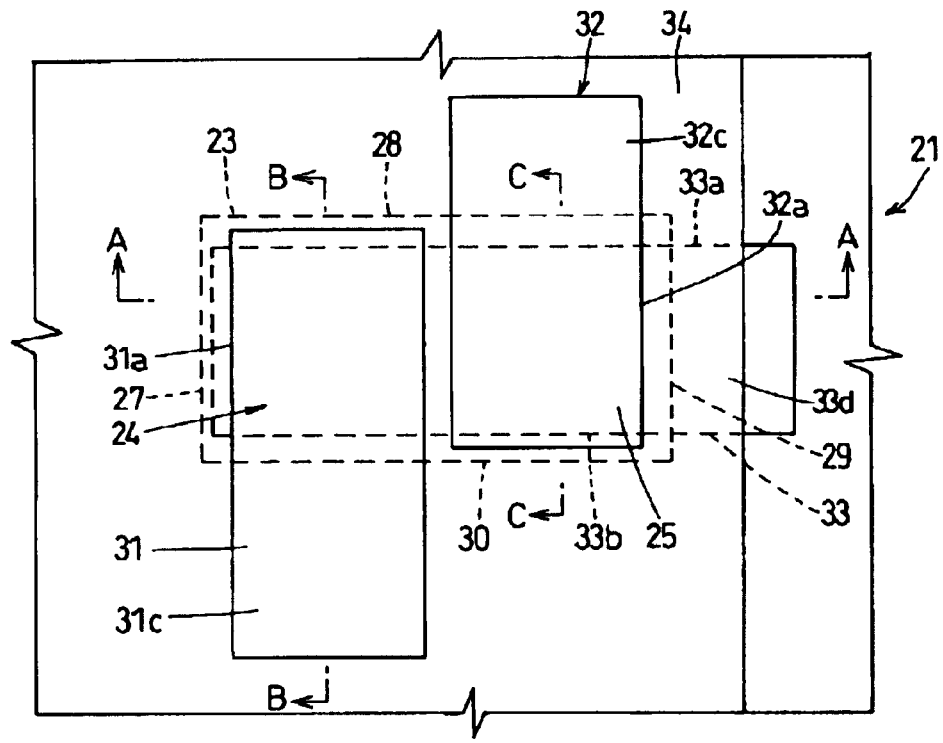
FIG. 10 is a top view showing the essential portion of the construction of a ladder filter as a piezoelectric filter according to another preferred embodiment of the present invention.
Figure 11:
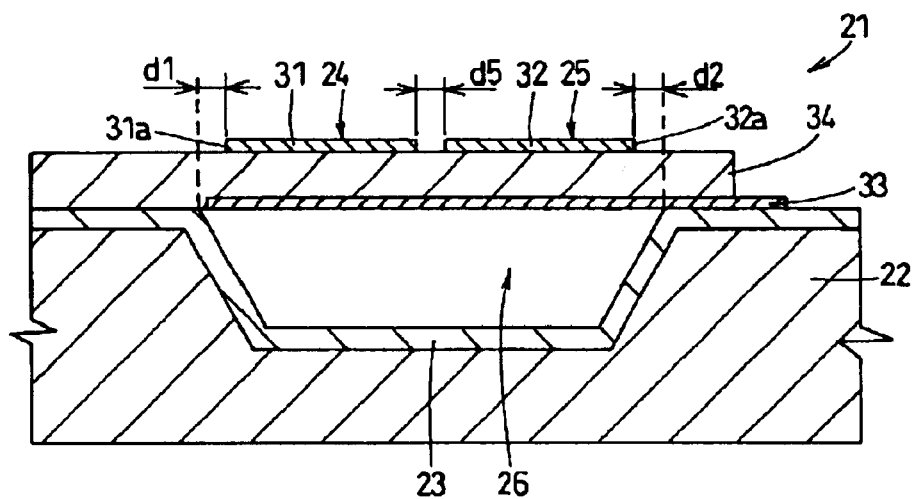
FIG. 11 is a sectional view taken along line A—A of FIG. 10.
Figure 12:
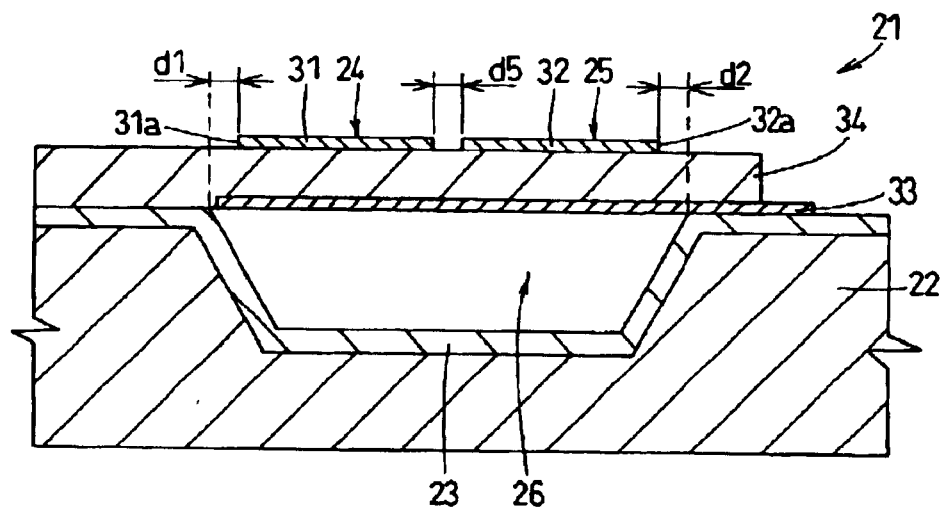
FIG. 12 is a sectional view taken along line B—B of FIG. 10.
Figure 13:
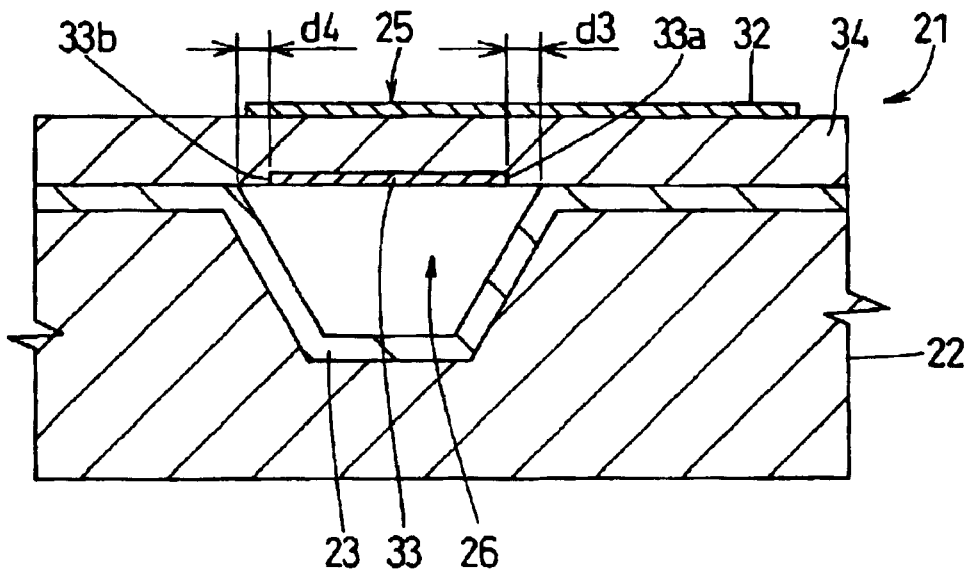
FIG. 13 is a sectional view taken along line C—C of FIG. 10.

FIG. 10 is a top view of a ladder filter as a piezoelectric filter according to another preferred embodiment of the present invention, FIG. 11 is a sectional view taken along line A—A in FIG. 10, FIG. 12 is a sectional view taken along line B—B in FIG. 10, and FIG. 13 is a sectional view taken along line C—C in FIG. 10.

The ladder filter 21 preferably includes a substrate 22, and first and second vibrating portions 24 and 25.

In this case, the substrate 22 and the first vibrating portion 24 constitute one piezoelectric resonator, and the substrate 22 and the second vibrating portion 25 constitute another piezoelectric resonator, respectively.

The substrate 22 is preferably made of a material such as silicon or other suitable material, and the substrate 22 preferably includes a concave portion 26, which is formed by etching or other suitable process.

The concave portion 26 of the substrate 22 is preferably substantially rectangular, when seen from the top, and the inside periphery includes elements which affect the vibration characteristics of each of the vibrating portions (hereinafter called vibration-affecting elements). Moreover, reference numeral 23 in the drawings represents an insulation layer of silicon dioxide or other suitable material.

Each of the vibrating portions 24 and 25 is preferably formed on the top surface of the substrate 22 by using well-known film-forming technologies so as to cover the concave portion 26, and constructed such that a piezoelectric thin film 34 including at least one layer of zinc oxide thin film or other suitable material, is sandwiched between a pair of left and right upper electrodes 31 and 32 and a lower electrode 33.

In these vibrating portions 24 and 25, one or more other thin films may be added to the piezoelectric thin film 34 to laminate them or other formulations may be considered. Accordingly, the vibrating portions 24 and 25 of the present preferred embodiment simply illustrate only one example and the present invention is not limited by the present preferred embodiment. Furthermore, the vibrating portions 24 and 25 may be formed by using known film-forming methods and accordingly their description is omitted.

Figure 14:
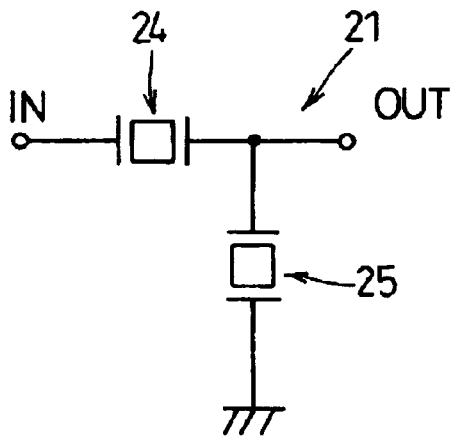
FIG. 14 is an electrical equivalent circuit diagram of the ladder filter in FIG. 10.

The vibrating portions 24 and 25 are connected to each other so as to constitute a ladder filter 21 shown in FIG. 14, which has a filtering function in a required frequency band.

The upper electrode 31 of the first vibrating portion 24 has a fixed electrode width, the left side surface 31a is separated by a distance of about $\lambda/2$ or more (i.e., $d1=\lambda/2$ or more, which is about half a vibration wavelength, the vibration wavelength represented by λ) from the left top edge of the concave portion 26 that is substantially parallel to the left side surface 31$a$, the bottom side in the drawing of the upper electrode 31 is extended on the substrate 22 to form an input portion (IN) 31$c$ of an electrical signal of the ladder filter 1.

The upper electrode 32 of the second vibrating portion 25 has a fixed electrode width, the right side surface 32$a$ is separated by a distance of about λ/2 or more (i.e., d2=λ/2 or more) from the right top edge of the concave portion 26 that is substantially parallel to the right side surface 32$a$, and the top side in the drawing of the upper electrode 32 is extended on the substrate 22 to form the electrically grounding portion (GND) 32$c$ of the ladder filter 21.

Both vibrating portions 24 and 25 have the lower electrode 33 in common, the upper surface 33$a$ of the electrode 33 is separated by a distance of about λ/2 or more (i.e., d3=λ/2 or more) from the upper top edge 28 of the concave portion 26, the lower side surface 33$b$ in the drawing is separated by a distance of about λ/2 or more (i.e., d4=λ/2 or more) from the lower top edge 30 of the concave portion 26 that is substantially parallel to the lower surface 33$b$, and the right-side end is extended on the substrate 2 to form an output potion (OUT) 33$d$ of an electrical signal of the ladder filter 1.

Furthermore, since both vibrating portions 24 and 25 become vibration affecting elements which affect the vibration characteristics of each other, the vibrating portions 24 and 25 are separated by a distance of about λ/2 or more (i.e., d5=λ/2 or more) from each other.

The ladder filter 1 having the above-described unique construction is electrically built as shown in FIG. 14. That is, the first vibrating portion 24 constitutes a first filtering element 24 and the second vibrating portion 25 constitutes a second filtering element 25. The input portion IN of the ladder filter 21 corresponds to the input portion 31$c$ of the first vibrating portion 24. The output portion OUT of the ladder filter 21 corresponds to the output portion 33$d$ of the second vibrating portion 25. The grounding portion GND of the ladder filter 21 corresponds to the grounding portion 32$c$ of the second vibrating portion 25.

In this way, in the present preferred embodiment, the first vibrating portion 24 and the second vibrating portion 25 are separated by at least about λ/2 from the vibration affecting elements. As a result, the first vibrating portion 24 and the second vibrating portion 25 can achieve their original vibrating characteristics without being influenced by the top edge of the concave portion and the other vibrating portions that define the vibrating affecting elements.

Furthermore, the distance between the first vibrating portion 24 and the vibrating affecting elements is more preferably about 3λ or less. The same thing can be said about the second vibrating portion 25 as in the first vibrating portion 24.

When the distance between the first vibrating portion 24 or the second vibrating portion 25 and the vibrating affecting elements is about 3λ or less, the resistance of the wiring between the resonators, the generation of an inductor component by the wiring, and degradation of the characteristics caused by such conditions is reliably prevented.

If the distance is greater than about 3λ to prevent vibrational interference, the wiring between the resonators is lengthened, and the resistance of the wiring and an inductance component due to the wiring are generated between the resonators, and, as a result, deterioration of the characteristics is caused. In particular, if the resistance of the wiring is inserted between the resonators connected in series, insertion loss increases.

Figure 15A:
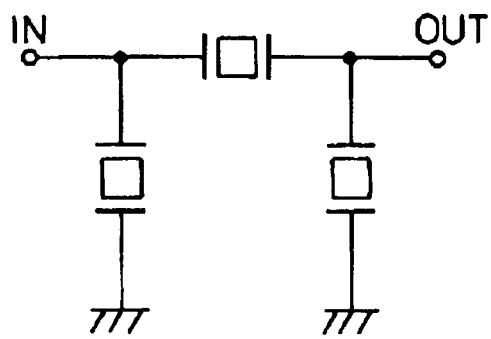
FIG. 15A is an electrical equivalent circuit diagram of a pi filter as a piezoelectric filter according to another preferred embodiment of the present invention.
Figure 15B:
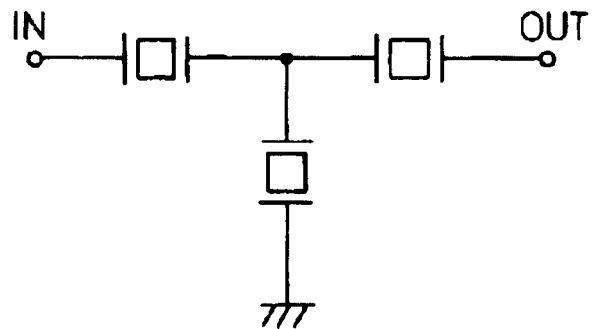
FIG. 15B is an electrical equivalent circuit diagram of a T-type filter as a piezoelectric filter according to another preferred embodiment of the present invention.
Figure 15C:
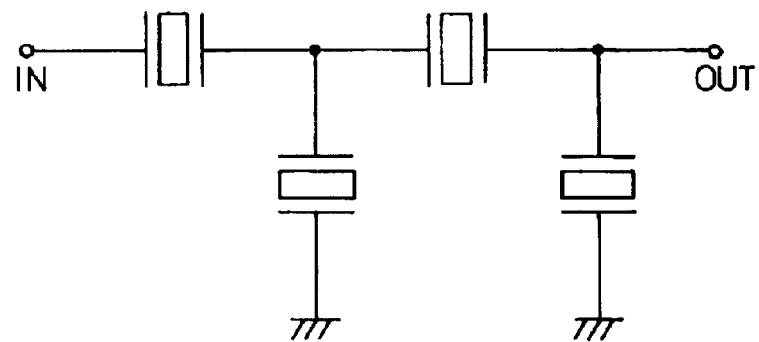
FIG. 15C is an electrical equivalent circuit diagram of two L-type filters as a piezoelectric filter according to another preferred embodiment of the present invention.

In the above-described preferred embodiments, although one example of a ladder filter as a piezoelectric filter is shown, the present invention can be applied to a pi-type filter shown in FIG. 15A, a T-type filter shown in FIG. 15B, and a ladder filter of two L-type filters shown in FIG. 15C in the same way such that the vibrating portions are separated by at least about λ/2 from vibration affecting elements, for example, the diaphragm fixing ends, the top edge of the concave portion, the other vibrating portions, and other portions, by changing the location and number of the vibrating portions on the substrate 2 and the connection of electrodes of the vibration portions.

Figure 16:
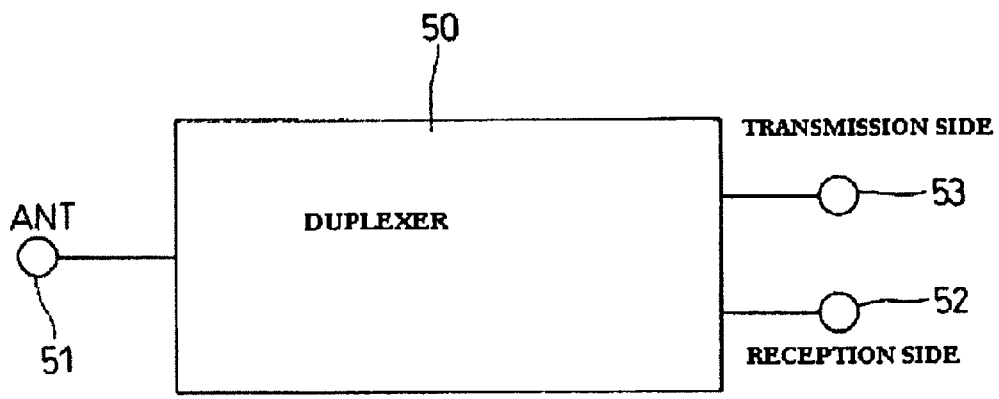
FIG. 16 is a schematic illustration of a duplexer of a preferred embodiment of the present invention.

A duplexer according to another preferred embodiment of the present invention will now be described. The duplexer 50 shown in FIG. 16 is provided with an antenna terminal 51, a reception-side terminal 52, and a transmission-side terminal 53. A piezoelectric resonator or piezoelectric filter according to other preferred embodiments of the present invention which allows only a required frequency band pass through is included between the reception-side terminal 52 and transmission-side terminal 53 and the antenna terminal 51.

Figure 17:
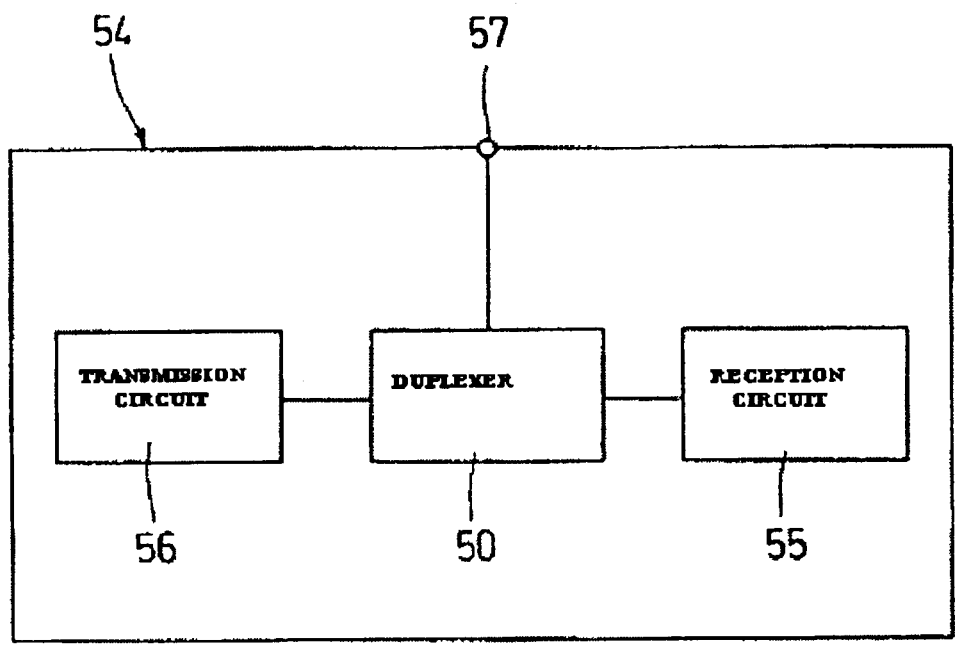
FIG. 17 is a schematic illustration showing one example of an electronic communication device of a preferred embodiment of the present invention.

A piezoelectric resonator or filter 1 according to the above-described preferred embodiments can be used in the electronic communication operation of various communication devices such as portable telephones, wireless LANs, and other suitable apparatuses, by mounting the resonator or the filter 1 on the communication devices. The outline of an electronic communication device 54 is shown in FIG. 17. The electronic communication device 54 is provided with a reception circuit 55 and a transmission circuit 56 included in the main body, and an antenna 57. Furthermore, vibrational transmission takes place between the antenna 57 and the transmission circuit 56 and reception circuit 55 through the duplexer 50 shown as described above.

The diaphragm fixing ends, the concave top edge, and the other vibrating portions were described as vibration affecting elements, but the vibration affecting elements are not limited to those described with respect to the present invention, and, in short, anything which may influence the vibration characteristics of vibrating portions is all included.

Moreover, the above-described piezoelectric resonator and filter may be produced such that the vibrating portions 4 and 5 are provided on the diaphragm 3 so as to be separated by at least about λ/2 from the diaphragm fixing ends 7 to 10 and the other vibrating portions which define elements affecting the vibration characteristics.

As described above, according to preferred embodiments of the present invention, in a piezoelectric resonator and piezoelectric filter including a substrate and a plurality of vibrating portions constructed such that a thin film portion having a piezoelectric thin film of one or more layers is sandwiched by at least a pair of upper electrodes and a lower electrode, which are disposed opposite to each other, on the upper and lower surfaces of the thin film portion, since the vibrating portions are separated by at least about λ/2 (λ represents the vibration wavelength) from the elements affecting the vibration characteristics, the vibration characteristics are not improperly influenced by the vibration affecting elements such as the opening end portions, etc., as in the case that, for example, the vibrating portions are too close to the opening end portions, etc., and accordingly, the piezoelectric resonator and piezoelectric filter of preferred embodiments of the present invention are easily made smaller while the vibration characteristics thereof are maintained.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric resonator comprising:

a substrate;

a piezoelectric thin film having one or more layers and disposed on the substrate; and a plurality of vibrating portions constructed such that a thin film portion having the piezoelectric thin film is sandwiched between at least a pair of upper electrodes and a lower electrode, which are disposed opposite to each other, on the upper and lower surfaces of the thin film portion; wherein the vibrating portions are separated by at least about $\lambda/2$, where $\lambda$ represents the vibration wavelength, from elements which affect the vibration characteristics.

2. A piezoelectric resonator as claimed in claim 1, wherein the substrate includes one of an opening portion and a concave portion, and the vibrating portions are located in the one of the opening portion and the concave portion.

3. A piezoelectric resonator as claimed in claim 1, wherein the elements which affect the vibration characteristics include an inside periphery of the one of the opening portion and the concave portion.

4. A piezoelectric resonator as claimed in claim 1, wherein the elements which affect the vibration characteristics includes the other vibrating portions.

5. A piezoelectric resonator as claimed in claim 1, wherein the vibrating portions include an insulation film below the lower electrode and a beam provided on the lower surface of the insulation film to increase the mechanical strength of the vibrating portions, and wherein the vibration portions are separated by at least about $\lambda/2$ from the beam.

6. A piezoelectric resonator as claimed in claim 1, wherein the vibration portions are separated by about $3\lambda$ or less from the elements which affect the vibration characteristics.

7. A piezoelectric resonator as claimed in claim 1, wherein the piezoelectric thin film includes one of zinc oxide and aluminum nitride as a main component.

8. A method of manufacturing of a piezoelectric resonator, comprising the steps of:

providing a substrate having one of an opening portion and a concave portion;

forming a piezoelectric thin film having one or more layers in the one of the opening portion and the concave portion;

forming a plurality of vibrating portions such that a thin film portion having the piezoelectric thin film is sandwiched between at least a pair of upper electrodes and a lower electrode, disposed opposite to each other, on the upper and lower surfaces of the thin film portion; and forming the vibrating portions to be separated by at least about $\lambda/2$, where $\lambda$ represents the vibration wavelength, from elements affecting the vibration characteristics, in the one of the opening portion and the concave portion.

9. A piezoelectric filter comprising:

a substrate;

a piezoelectric thin film having one or more layers disposed on the substrate; and a plurality of vibrating portions constructed such that a thin film portion having the piezoelectric thin film is sandwiched between at least a pair of upper electrodes and a lower electrode, disposed opposite to each other, on the upper and lower surfaces of the thin film portion; wherein the vibrating portions are connected to constitute a filter for a required frequency band and wherein the vibrating portions are separated by at least about $\lambda/2$, where $\lambda$ represents the vibration wavelength, from elements affecting the vibration characteristics.

10. A piezoelectric filter as claimed in claim 9, wherein the other vibrating portions constitute the elements affecting the vibration characteristics.

11. An electronic communication device comprising a piezoelectric filter as claimed in claim 10, the piezoelectric filter being used in the operation of electronic communication.

12. A piezoelectric filter as claimed in claim 9, wherein the substrate includes one of an opening portion and a concave portion and wherein the vibrating portions are disposed in the one of the opening portion and the concave portion.

13. A piezoelectric filter as claimed in claim 9, wherein the periphery of the one of the opening portion and the concave portion constitutes the elements affecting the vibration characteristics.

14. A piezoelectric filter as claimed in claim 9, wherein the vibrating portions include an insulation film below the lower electrode and a beam provided on the lower surface of the insulation film to increase the mechanical strength of the vibrating portions and wherein the vibration portions are separated by at least about $\lambda/2$ from the beam.

15. A piezoelectric filter as claimed in claim 9, wherein the vibration portions are separated by about $3\lambda$ or less from the elements affecting the vibration characteristics.

16. A piezoelectric filter as claimed in claim 9, wherein the piezoelectric thin film includes one of zinc oxide and aluminum nitride as a main component.

17. A piezoelectric filter as claimed in claim 9, wherein the vibrating portions constitute a ladder filter.

18. A duplexer comprising a piezoelectric filter as claimed in claim 9.

19. An electronic communication device comprising a piezoelectric filter as claimed in claim 9, the piezoelectric filter being used in the operation of electronic communication.

20. A method of manufacturing a piezoelectric filter, comprising the steps of:

providing a substrate having one of an opening portion and a concave portion;

forming a piezoelectric thin film having one or more layers in the one of the opening portion and the concave portion;

forming a plurality of vibrating portions such that a thin film portion having the piezoelectric thin film is sandwiched between at least a pair of upper electrodes and a lower electrode, disposed opposite to each other, on the upper and lower surfaces of the thin film portion;

constructing a filter for a required frequency band by arranging the vibrating portions; and forming the vibrating portions to be separated by at least about $\lambda/2$, where $\lambda$ represents the vibration wavelength, from elements affecting the vibration characteristics.

* * * * *